United States Patent
Lee et al.

(10) Patent No.: US 7,950,567 B2
(45) Date of Patent: May 31, 2011

(54) ORGANIC LIGHT EMITTING DIODE DISPLAY DEVICE AND METHOD OF FABRICATING THE SAME

(75) Inventors: Jae-Seob Lee, Suwon (KR); Kyu-Sung Lee, Suwon (KR); Jung-Ha Lee, Suwon (KR)

(73) Assignee: Samsung Mobile Display Co., Ltd, Gyeonggi-do (KR)

(*) Notice: Subject to any disclaimer, the term of this patent is extended or adjusted under 35 U.S.C. 154(b) by 301 days.

(21) Appl. No.: 12/137,353

(22) Filed: Jun. 11, 2008

(65) Prior Publication Data

US 2008/0311361 A1 Dec. 18, 2008

(30) Foreign Application Priority Data

Jun. 12, 2007 (KR) .................. 10-2007-0057311

(51) Int. Cl.
*B23K 31/00* (2006.01)
*B23K 20/12* (2006.01)

(52) U.S. Cl. ............ 228/233.1; 228/234.1; 228/235.1; 427/532; 427/533; 427/534; 427/535; 427/536; 427/537; 313/498; 313/499; 313/500; 313/501; 313/505; 313/506; 313/507; 313/508; 313/509; 313/512; 445/25

(58) Field of Classification Search ............ 228/233.1, 228/234.1, 235.1; 427/532–537; 313/498–512; 445/25
See application file for complete search history.

(56) References Cited

U.S. PATENT DOCUMENTS

| | | | | |
|---|---|---|---|---|
| 2,559,864 A | * | 7/1951 | Firth | ............... 116/137 A |
| 2,961,354 A | * | 11/1960 | Cleveland | ............... 438/765 |
| 5,407,856 A | | 4/1995 | Quenzer et al. | |
| 5,418,002 A | | 5/1995 | Paik et al. | |
| 5,915,193 A | | 6/1999 | Tong et al. | |
| 5,938,104 A | | 8/1999 | Saxelby, Jr. et al. | |
| 5,996,594 A | | 12/1999 | Roy et al. | |

(Continued)

FOREIGN PATENT DOCUMENTS

CN 1711000 12/2005

(Continued)

OTHER PUBLICATIONS

The Notification of the First Office Action for Chinese Patent Application No. 200810132015.8 dated Dec. 25, 2009 by State Intellectual Property Office of P.R. China.

(Continued)

*Primary Examiner* — Jessica L Ward
*Assistant Examiner* — Erin B Saad
(74) *Attorney, Agent, or Firm* — Knobbe Martens Olson & Bear LLP

(57) ABSTRACT

An organic light emitting diode (OLED) display device and a method of fabricating the same are disclosed. In one embodiment, the method includes: i) preparing a support and a flexible layer, ii) forming a first metal layers on one side of a support and a second metal layer on one side of a flexible layer, iii) performing a cleaning process to the first metal layer and the second metal layer, iv) forming a first radical layer on the first metal layer and a second radical layer on the second metal layer and v) joining the first and second radial layers to each other. At least one embodiment of the invention enhances process convenience and manufacturing yield, and reduces manufacturing costs and time for a flat panel display device having a flexible substrate.

16 Claims, 3 Drawing Sheets

U.S. PATENT DOCUMENTS

| | | | |
|---|---|---|---|
| 6,131,795 A * | 10/2000 | Sato | 228/102 |
| 6,180,496 B1 | 1/2001 | Farrens et al. | |
| 6,787,885 B2 | 9/2004 | Esser et al. | |
| 6,949,403 B2 * | 9/2005 | Xiao et al. | 438/99 |
| 7,087,134 B2 | 8/2006 | Chen et al. | |
| 2003/0188553 A1 | 10/2003 | Mann et al. | |
| 2004/0121568 A1 | 6/2004 | Kim et al. | |
| 2005/0214551 A1 | 9/2005 | Aida | |
| 2006/0085965 A1 * | 4/2006 | Suga et al. | 29/514 |
| 2006/0093838 A1 | 5/2006 | Kohayashi et al. | |
| 2006/0135028 A1 | 6/2006 | Klyszcz et al. | |
| 2006/0234472 A1 * | 10/2006 | Gabriel et al. | 438/455 |
| 2008/0311361 A1 | 12/2008 | Lee et al. | |

FOREIGN PATENT DOCUMENTS

| | | |
|---|---|---|
| CN | 1750925 | 3/2006 |
| JP | 1999-165951 | 6/1999 |
| JP | 2000-311781 | 11/2000 |
| JP | 2000-353797 | 12/2000 |
| JP | 2002-192651 | 7/2002 |
| JP | 2004-006707 | 1/2004 |
| JP | 2005-256061 | 9/2005 |
| JP | 2006-123425 | 5/2006 |
| KR | 1998-081324 | 11/1998 |
| KR | 10-2002-0038324 | 5/2002 |
| KR | 10-2004-0108705 | 12/2004 |
| KR | 10-2005-0022953 | 3/2005 |
| KR | 10-2006-0028537 | 3/2006 |
| KR | 10-0571848 | 4/2006 |
| KR | 10-2006-0041609 | 5/2006 |
| KR | 10-2006-0063607 | 6/2006 |
| KR | 10-2006-0088562 | 8/2006 |

OTHER PUBLICATIONS

European Search Report for European Patent Application No. 08252458.8 dated Apr. 23, 2009 by European Patent Office.

* cited by examiner

ORGANIC LIGHT EMITTING DIODE DISPLAY DEVICE AND METHOD OF FABRICATING THE SAME

CROSS-REFERENCE TO RELATED APPLICATION

This application claims priority to and the benefit of Korean Patent Application No. 2007-57311, filed on Jun. 12, 2007, the disclosure of which is incorporated herein by reference in its entirety.

BACKGROUND OF THE INVENTION

1. Field of the Invention

The present invention relates to a joining method for enhancing process convenience and manufacturing yield, but reducing manufacturing costs and a method of fabricating an organic light emitting diode (OLED) display device using the same. More particularly, the present invention relates to a method of joining a support to a flexible layer and a method of fabricating an OLED display device using the same.

2. Description of the Related Technology

To meet a demand for securing a sufficient viewing angle, a flat panel display device should be able to bend to some degree by applying a predetermined tension thereto. The flexibility of the device is generally required to be employed in portable products such as armbands, wallets or notebook computers.

To provide such a flexible flat panel display device, a flexible substrate is generally used. The flexible substrate may include a plastic substrate, a metallic thin film, etc.

Also, in manufacturing a flat panel display device using such a flexible layer (or flexible substrate), a support is generally used since it is difficult to control the flexible layer during the manufacturing process. Accordingly, after the support is adhered to the flexible layer using an adhesive, the process is performed to form a flat panel display device, and then the support is detached from the flat panel display device.

SUMMARY OF CERTAIN INVENTIVE ASPECTS

One aspect of the present invention is a joining method for enhancing process convenience and manufacturing yield, but reducing manufacturing costs and a method of fabricating an organic light emitting diode (OLED) display device using the same.

Another aspect of the present invention is a joining method which includes: preparing a support and a flexible layer; forming a first metal layer on one side of the support and a second metal layer on one side of the flexible layer; performing a cleaning process to the first metal layer and the second metal layer; forming a first radical layer on the first metal layer and a second radical layer on the second metal layer by a plasma process; and joining the first radical layer to the second radical layer.

Another aspect of the present invention is a method of manufacturing an OLED display device which includes: preparing a support and a flexible layer; forming a first metal layer on one side of the support and a second metal layer on one side of the flexible layer; performing a cleaning process to the first metal layer and the second metal layer; forming a first radical layer on the first metal layer and a second radical layer on the second metal layer; joining the first radical layer to the second radical layer; forming an OLED display device comprising a first electrode, an organic layer having an emission layer and a second electrode on the other side of the flexible layer; and detaching the flexible layer having the OLED from the support.

Another aspect of the invention is a joining method comprising: i) providing a support and a flexible substrate, ii) forming a first metal layer on one side of the support and a second metal layer on one side of the flexible substrate, iii) performing a cleaning process on the first metal layer and the second metal layer, iv) forming a first radical layer on the first metal layer and a second radical layer on the second metal layer by a plasma process and v) joining the first radical layer to the second radical layer so that the flexible substrate, second metal layer, second radical layer, first radical layer, first metal layer and support are stacked in this order.

In the above method, the cleaning process may comprise first to third cleaning processes, wherein the first and third cleaning processes may be to dry the metal layers after immersing them in deionized water or organic cleaning liquid, and wherein the second cleaning process may be performed by D-sonic and rinse methods using deionized water. In the above method, the first metal layer and the second metal layer may be formed by one of the following: an ion exchange method, an adsorption method, an ion injection method, a coating method, a sputtering method and a deposition method. In the above method, the first metal layer and the second metal layer may be formed to a thickness of about 1000 Å to about 10000 Å.

In the above method, the first metal layer and the second metal layer may comprise one of iron, nickel, tin, zinc, chrome, cobalt, silicon, magnesium, titanium, zirconium, aluminum, silver, copper and an alloy thereof. In the above method, the first radical layer and the second radical layer may be joined to each other by covalent bonding. In the above method, the joining process may comprise first and second joining processes, wherein the first joining process may be performed at room temperature, and wherein the second joining process may be performed by pressing and annealing.

Another aspect of the invention is a method of fabricating an organic light emitting diode (OLED) display device, comprising: i) providing a support and a flexible substrate, wherein the flexible substrate comprises first and second surfaces opposing each other, ii) forming a first metal layer on one side of the support and a second metal layer on the first surface of the flexible substrate, iii) performing a cleaning process on the first metal layer and the second metal layer, iv) forming a first radical layer on the first metal layer and a second radical layer on the second metal layer, v) joining the first radical layer to the second radical layer so that the flexible substrate, second metal layer, second radical layer, first radical layer, first metal layer and support are stacked in this order, vi) forming an OLED display device on the second surface of the flexible substrate, wherein the OLED display device comprises a first electrode, an organic layer having an emission layer, and a second electrode and vii) detaching the first surface of the flexible substrate from the second metal layer.

In the above method, the cleaning process may comprise first to third cleaning processes, wherein the first and third cleaning processes may be to dry the metal layers after immersing them in deionized water or organic cleaning liquid, and wherein the second cleaning process may be performed by D-sonic and rinse methods using deionized water. In the above method, the first metal layer and the second metal layer may be formed by one of the following: an ion exchange method, an adsorption method, an ion injection method, a coating method, a sputtering method and a deposition method.

In the above method, the first metal layer and the second metal layer may be formed to a thickness of about 1000 Å to about 10000 Å. In the above method, the first metal layer and the second metal layer may comprise one of iron, nickel, tin, zinc, chrome, cobalt, silicon, magnesium, titanium, zirconium, aluminum, silver, copper and an alloy thereof. In the above method, the first radical layer and the second radical layer may be formed by a plasma process. In the above method, the joining process may comprise first and second joining processes, wherein the first joining process may be performed at room temperature, and wherein the second joining process may be performed by pressing and annealing.

Still another aspect of the invention is an organic light emitting diode (OLED) display device, comprising: i) a flexible substrate comprising first and second surfaces opposing each other, ii) a first electrode disposed on the first surface of the substrate and iii) an organic layer including an organic emission layer and a second electrode which are disposed on the first electrode, wherein a metal layer is disposed on the second surface of the substrate.

In the above device, the metal layer may comprise one of iron, nickel, tin, zinc, chrome, cobalt, magnesium, titanium, zirconium, aluminum, silver, copper and an alloy thereof. In the above device, the metal layer may be formed to a thickness of about 1000 Å to about 10000 Å.

Still another aspect of the invention is a joining method for a flat panel display device which comprises a flexible substrate, the method comprising: i) providing a support and a flexible substrate, wherein the flexible substrate comprises first and second surfaces opposing each other, ii) forming a first metal layer on one side of the support and a second metal layer on the first surface of the flexible substrate and iii) joining the first metal layer to the second metal layer.

The joining method may further comprise forming a first radical layer on the first metal layer and a second radical layer on the second metal layer, wherein the first radical layer may be joined to the second radical layer so that the flexible substrate, second metal layer, second radical layer, first radical layer, first metal layer and support are stacked in this order. The joining method may further comprise: i) forming a flat panel display device on the second surface of the flexible substrate and ii) detaching the first surface of the flexible substrate from the second metal layer so that the flexible substrate is incorporated into the flat panel display device.

BRIEF DESCRIPTION OF THE DRAWINGS

Embodiments of the present invention will be described with reference to the attached drawings.

DETAILED DESCRIPTION OF CERTAIN INVENTIVE EMBODIMENTS

Figure 1A:
FIGS. 1A to 1D are cross-sectional views illustrating a joining method according to an exemplary embodiment of the present invention.

To manufacture a typical flat panel display device using a flexible layer, a support is first directly adhered to the flexible layer. During the process of applying an organic adhesive to the support and the flexible layer, a process chamber is used and it becomes significantly polluted. Purifying the polluted process chamber increases processing time since the chamber must be reused fore the next display. In addition, using a polluted organic adhesive results in a restriction of the processing temperature to about 300° C. or lower. With the described technique, it is difficult to uniformly form the organic adhesive on the support and the flexible layer, so that the support and flexible layer do not adhere uniformly.

Embodiments of the present invention will now be described more fully hereinafter with reference to the accompanying drawings, in which exemplary embodiments of the invention are shown. In the drawings, the thicknesses of layers and regions are exaggerated for clarity. The same reference numerals are used to denote the same elements.

FIGS. 1A to 1D are cross-sectional views illustrating a joining method according to an exemplary embodiment of the present invention.

Referring to FIG. 1A, a support 10 and a flexible layer 20 are provided. The support 10 may have a predetermined strength to facilitate control during the following process. Also, the material may include metal, glass, silicon or quartz.

The flexible layer (or flexible substrate) 20 may have excellent heat stability and act as a diffusion barrier with respect to moisture and oxygen. Also, the flexible layer 20 may be formed of plastic or stainless steel (STS), and may be formed of an ultra-thin glass of about 0.1 mm or thinner as well.

Figure 1B:

Referring to FIG. 1B, a first metal layer 31 is formed on one side of the support 10, and a second metal layer 32 is formed on one side of the flexible layer 20. The first metal layer 31 and the second metal layer 32 act to prevent the flexible layer 20 from being irregularly joined to the support 10 due to the surface roughness of the support 10 and the flexible layer 20 during the following joining process. Further, since the first metal layer 31 and the second metal layer 32 are formed on each one side of the support 10 and the flexible layer 20, a process of polishing surfaces of the support 10 and the flexible layer 20 may be omitted.

In one embodiment, the first metal layer 31 and the second metal layer 32 may be formed to a thickness of about 1000 Å to about 10000 Å, and or, to a thickness of about 10000 Å. In another embodiment, depending on required joining accuracy, the thickness may be less than about 1000 Å or greater than about 10000 Å. According to one embodiment, regardless of the surface roughness of the support 10 and the flexible layer 20, a uniform joining can be achieved, which can reduce manufacturing costs and time.

In one embodiment, the first metal layer 31 may be directly joined to the second metal layer 32 in the following annealing process. In this embodiment, the metal layers 31 and 32 may be formed of a material having a low melting point. For example, they may be formed of iron (Fe), nickel (Ni), tin (Sn), zinc (Zn), chrome (Cr), cobalt (Co), magnesium (Mg), titanium (Ti), zirconium (Zr), aluminum (Al), silver (Ag), copper (Cu) or an alloy thereof.

Then, to remove foreign substances generated while the first metal layer 31 and the second metal layer 32 are formed, a cleaning process may be performed on the first metal layer 31 and the second metal layer 32. The cleaning process may be performed three times. The first cleaning process may include removing the foreign substances existing on the first metal layer 31 and the second metal layer 32, immersing the first metal layer 31 and the second metal layer 32 in deionized water or an organic cleaning solution and drying them using isopropyl alcohol (IPA).

Subsequently, the second cleaning process may be performed using a D-sonic method and a rinse method on the first metal layer 31 and the second metal layer 32, on which the first cleaning process is performed. Here, the D-sonic method may include immersing the support 10 and the flexible layer 20, on which the first metal layer 31 and the second metal layer 32 are respectively formed in deionized water, and cleaning them using high frequency sonic energy. Also, in the rinse method, the rotating first and second metal layers 31 and 32 may be cleaned by spraying deionized water.

The third cleaning process is performed on the first metal layer 31 and the second metal layer 32, on which the second cleaning process is performed, by the same method as the first cleaning process.

Then, an annealing process may be performed on the first metal layer 31 and the second metal layer 32, on which the third cleaning process is performed, at a temperature of about 100° C. to about 140° C. The annealing process is performed to completely or substantially completely remove the deionized water or the organic cleaning solution that may remain on the first metal layer 31 and the second metal layer 32. In another embodiment, less than or more than three cleaning processes may be used depending on required joining accuracy.

Figure 1C:
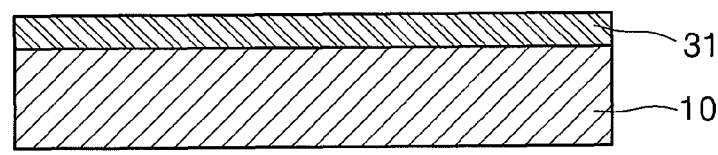
Figure 1C:
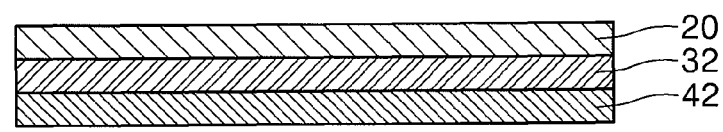

Referring to FIG. 1C, a plasma process is performed on surfaces of the first metal layer 31 and the second metal layer 32 to be activated, so that a first radical layer 41 and a second radical layer 42 are respectively formed on each one side of the first metal layer 31 and the second metal layer 32.

Describing the plasma process, the support 10 and the flexible layer 20, on which the first metal layer 31 and second metal layer 32 are respectively formed, are introduced into a plasma processing container. Then, the processing container is vacuum-exhausted to maintain the processing pressure of the processing container to about $1\times10^{-2}$~about $5\times10^{-1}$ torr, and or, to about $1\times10^{-1}$ torr.

Subsequently, a plasma generating gas such as $O_2$, Ar, $N_2$, $H_2$ or $SF_6$ is supplied at a flow rate of about 10 sccm to about 100 sccm to the plasma generating space through a gas supplying path. Here, the plasma generating gas may include $O_2$ or $SF_6$ that exhibits excellent reaction, and the gas flow rate may be about 50 sccm.

An RF electric power of about 50W to about 500W may be applied to the plasma generating means to generate plasma such as $O_2$, Ar, $N_2$, $H_2$ or $SF_6$ in the plasma generating space, so that the first radical layer 41 and the second radical layer 42 can be respectively formed on the first metal layer 31 and the second metal layer 32. The RF electric power may be about 200W, and the plasma processing process may be performed for about 30 seconds to about 300 seconds.

Figure 1D:
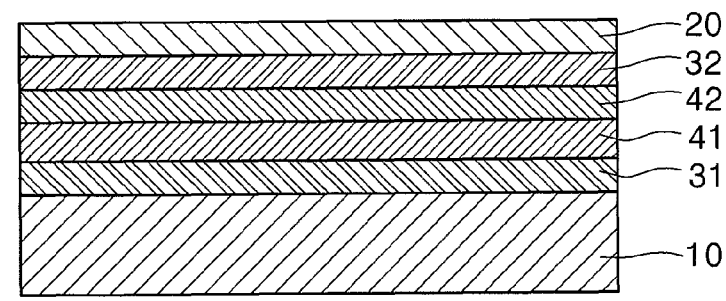

Referring to FIG. 1D, the support 10, on which the first radical layer 41 is formed, and the flexible layer 20, on which the second radical layer 42 is formed, are introduced into a clean room of about class 100 or better. Then, the support 10 and the flexible layer 20 are disposed such that the first radical layer 41 is in contact with the second radical layer 42 to thereby perform a first joining process. Here, the clean room is maintained at room temperature, and the class 100 means that 100 dust particles exist in a space of 30 cm×30 cm×30 cm.

When the first radical layer 41 is in contact with the second radical layer 42, covalent bonding between radical groups of the first radical layer 41 and the second radical layer 42 is formed, so that the first radical layer 41 is joined to the second radical layer 42. For example, when the support 10 is formed of a silicon substrate and the flexible layer 20 is formed of stainless steel, covalent bonding is formed between an oxygen radical combined with silicon and an oxygen radical combined with chrome to form a first joining.

Then, after pressure is applied to the first radical layer 41 and the second radical layer 42, on which the first joining process is performed, and an annealing process is performed, a distance between the first radical layer 41 and the second radical layer 42 is reduced to form a second joining. This is because the first radical layer 41 and the second radical layer 42, on which the first joining process is performed, are simply joined to each other by a covalent bonding, but the joining density between the first radical layer 41 and the second radical layer 42 is increased by the heat and pressure. Accordingly, each joining between the first radical layer 41 and the second radical layer 42 and between the first metal layer 31 and the second metal layer 32 is converted into metal bonding that exhibits excellent adhesion to be directly joined to each other. As a result, while the distance between the support 10 and the flexible layer 20, on which the first joining process is performed, is about 20 Å to about 30 Å. Further, the distance between the support 10 and the flexible layer 20, on which the second joining process is performed, is about 3 Å to about 4 Å, and joint strength after the second joining process is stronger than that after the first joining process.

Here, the pressure applied to the support 10 and the flexible layer 20 for the second joining process is about 0.1 MPa to about 50 MPa, or about 0.5 MPa. Also, the annealing process is performed at a temperature of about 200° C. to about 600° C., or at a temperature of about 400° C. to about 450° C., and the processing time is about 0.5 hours to about 2 hours, or about 0.5 hours.

The description of a joining method according to an exemplary embodiment of the present invention will be finished.

FIGS. 2A to 2E are cross-sectional views illustrating a method of manufacturing an organic light emitting diode (OLED) display device using the joining method according to an exemplary embodiment of the present invention. It is appreciated that a joining method according to one embodiment of the invention can be applied to manufacturing of other flat panel displays such as a liquid crystal display (LCD), a field emission display (FED), other flat panel displays having a flexible substrate. For convenience, a manufacturing procedure for an OLED using the joining method will be described below.

Figure 2A:
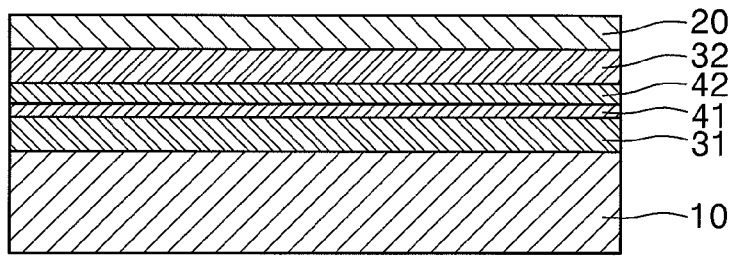
FIGS. 2A to 2E cross-sectional views illustrating a method of fabricating an organic light emitting diode (OLED) display device using a joining method according to an exemplary embodiment of the present invention.

Referring to FIG. 2A, a formed flexible layer 20 is provided on a support 10. The support 10 is directly joined to the flexible layer 20 by a first metal layer 31 and a second metal layer 32. Since the joining method of the support 10 and the flexible layer 20 was described with reference to FIGS. 1A to 1D, detailed descriptions thereof will be omitted.

Figure 2B:
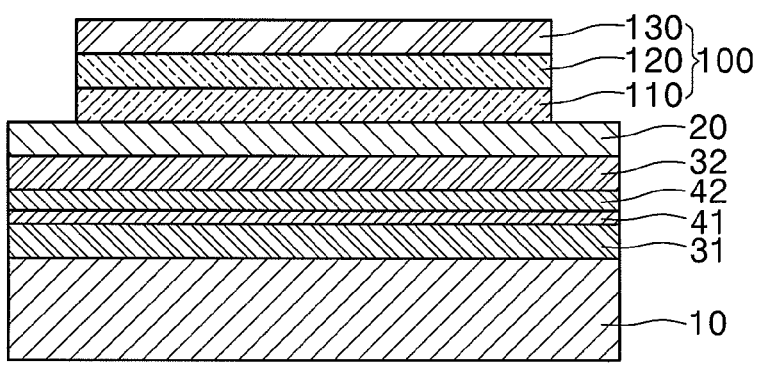

Referring to FIG. 2B, an organic light emitting diode (OLED) 100 including a first electrode 110, an organic layer 120 and a second electrode 130 is formed on the flexible layer 20.

The first electrode 110 may be a double or triple structure including a reflective layer. When the first electrode 110 has a double structure, it may have a structure, in which a reflective layer formed of aluminum, silver or an alloy thereof and a transparent conductive layer formed of ITO, IZO or ITZO are sequentially stacked. Also, when the first electrode 110 has a triple structure, it may have a structure, in which a first metal layer formed of titanium, molybden, ITO or an alloy thereof, a second metal layer formed of aluminum, silver or an alloy thereof, and a third metal layer consisting of ITO, IZO or ITZO are sequentially stacked. The first electrode 110 may be formed by a sputtering method.

Also, the organic layer 120 may include one of a white emission layer, a red emission layer, a green emission layer and a blue emission layer.

Here, the white emission layer may be formed of a single layer or a multi-layer. When the white emission layer is a single layer, the white light may be obtained by adding emission materials respectively emitting light of different colors into a dopant or by mixing a carbazole-based molecule, polyvinyl carbazole (PVK) with PBD, TPB, Coumarin$_6$, DCM$_1$, and Nile red at an appropriate rate. In addition, the white emission material may be obtained by mixing emission materials of two different colors, and adding the remaining emission material into the mixed material. For example, after a red emission material is mixed with a green emission layer, a blue emission layer is added into the mixed layer to obtain a white emission material. The red emission material may be formed of one selected from a polymer material such as polythiophene (PT), and derivatives thereof. Furthermore, the green emission material may be formed of a low molecular material such as aluminum quinolate (Alq$_3$), BeBq$_2$ and Almq, a polymer material such as poly(p-phenylenevinylene) (PPV), or derivatives thereof. The blue emission material may be formed of a low molecular material such as ZnPBO, Balq, DPVBi and OXA-D, a polymer material such as polyphenylene (PPP), or derivatives thereof.

When the white emission layer is a multilayer, it may be formed of a double layer emitting light of different wavelength regions. One portion of the double layer may be an emission layer emitting light of an orange-red region and the other portion may be an emission layer emitting light of a blue region. The emission layer emitting light of the orange-red region may be a phosphorescent emission layer, and the emission layer emitting light of the blue region may be a fluorescent emission layer. The phosphorescent emission layer generally has much better emission characteristics than those of the fluorescent emission layer emitting light of the same wavelength region, and the fluorescent emission layer generally has much better life span characteristics than those of the phosphorescent emission layer. Therefore, when the white emission layer is formed by stacking the phosphorescent emission layer emitting light of the orange-red region and the fluorescent emission layer emitting light of blue region, its luminous efficiency and life span characteristics may be improved. Also, the white emission layer that is a double layer may be formed of a polymer material, a low molecular material or a combination thereof.

When the white emission layer has a triple layer structure, red, green, and blue emission layers may be stacked, and the layer stacking sequence is not particularly limited. Further, the red, green, and blue emission layers used for the white emission layer may be formed of an emission layer than emits a single color.

The red emission layer may be formed of a low molecular material such as Alq$_3$ (a host)/DCJTB (a fluorescent dopant), Alq$_3$ (a host)/DCM (a fluorescent dopant) and CBP (a host)/PtOEP (a phosphorescent organic metal complex), or a polymer material such as a polyfluorene (PFO)-based polymer, or a combination thereof.

The green emission layer may be formed of a low molecular material such as Alq$_3$, Alq$_3$ (a host)/C545t (a dopant), and CBP (a host)/IrPPY (a phosphorescent organic material complex), or a polymer material such as a PFO-based polymer and a PPV-based polymer, or a combination thereof.

The blue emission layer may include a host and a dopant. The host may be formed of an amine compound such as TMM-004 (available from Covion Organic Semiconductors), 3-(4-tert-butylphenyl)-4-phenyl-5(4-bi-.phenyl), spiro-6P, a PFO-based polymer or a PPV-based polymer, or a combination thereof. The dopant may be distyrylbenzene (DSB), distyrylarylene (DSA), bis[2-(4,6-difluorophenyl)pyridinato-N,C2']iridium picolinate (F$_2$Irpic) or tris[1-(4,6-difluorophenyl)pyrazolate-N,C2']iridium(Ir[dfppz]3), or a combination thereof.

Also, the organic layer 220 may include at least one layer selected from the group consisting of a hole injection layer (HIL), a hole transport layer (HTL), an electron injection layer (EIL), an electron transport layer (ETL) and a hole blocking layer (HBL).

The HIL serves to facilitate injection of a hole into an organic emission layer to increase the life span of a device. The HIL may be formed of an aryl amine compound and starburst-based amine. More specifically, the HIL may be formed of 4,4',4"-tris(3-methylphenylphenylamino)triphenylamino (m-MTDATA), 1,3,5-tris[4-(3-methylphenylphenylamino)phenyl]benzene (m-MTDATB), phtarocyanine copper (CuPc), or a combination thereof.

The HTL may be formed of an arylene thiamine derivative, a starburst compound, a biphenyl thiamine derivative having a spiro radical, a ladder type compound, and so on. More specifically, the HTL may be formed of N,N-diphenyl-N,N'-bis(4-methylphenyl)-1,1'-biphenyl-4,4'-thiamine (TPD) or 4,4'-bis[N-(1-Naphthyl)-N-phenylamino]biphenyl (NPB), or a combination thereof.

The HBL serves to prevent a hole from moving into the EBL when hole mobility is larger than electron mobility in the organic emission layer. The HBL may be formed of one material selected from the group consisting of 2-biphenyl-4-il-5-(4-t-buthylphenyl)-1,3,4-oxythiazol (PBD), spiro-PBD, and 3-(4'-tert-buthylphenyl)-4-phenyl-5-(4'-biphenyl)-1,2,4-triazol (TAZ).

The ETL may be formed of a metal compound capable of readily receiving an electron, and may be formed of 8-hydroquinoline aluminum (Alq$_3$) having excellent characteristics capable of safely transporting the electron supplied from a cathode electrode.

The EIL may be formed of one or more materials selected from the group consisting of 1,3,4-oxidiazol derivatives, 1,2, 4-triazol derivatives and LiF.

In addition, the organic layer 120 may be formed by one of a vacuum deposition method, an ink jet printing method, and a laser induced thermal imaging method.

The second electrode 130 may be a semi-transmissive electrode and may be formed of magnesium-silver (MgAg) or aluminum-silver (AlAg). Here, the magnesium may be formed by co-depositing magnesium and silver, and the aluminum may be formed by sequentially stacking aluminum and silver to form a stacked structure. Further, a transparent conductive layer such as ITO or IZO may be formed on the second electrode 130.

Here, a thin film transistor, a capacitor or an insulating layer may be further included between the first electrode 110 and the flexible layer 20.

Figure 2C:
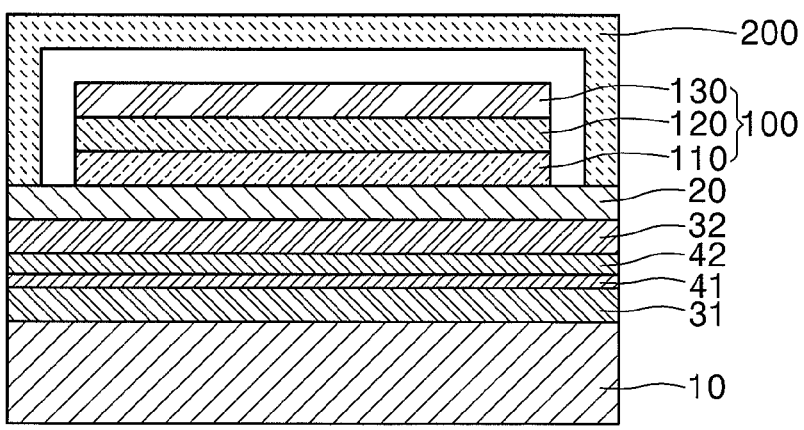

Referring to FIG. 2C, an encapsulation substrate 200 sealed with the flexible layer 20 is provided to prevent the OLED 100 from moisture or outer air. The encapsulation substrate 200 may be formed of glass or plastic so that light emitted from the OLED 100 can pass through. In addition, the encapsulation substrate 200 and the flexible layer 20 of may be adhered to each other by a sealant or a frit.

Figure 2D:
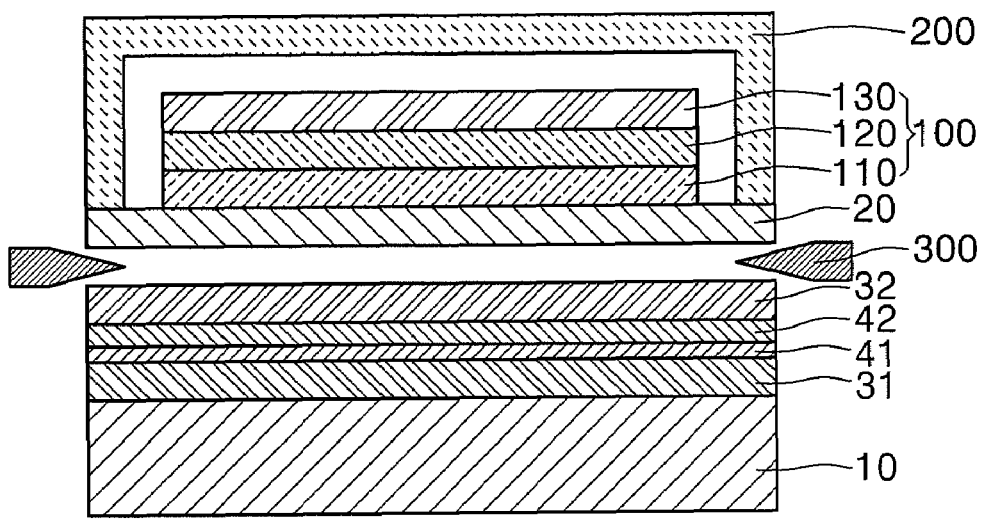

Referring to FIG. 2D, the flexible layer 20, on which the OLED 100 is formed, is detached from the support 10. A detaching device 300 is used to detach the flexible layer 20 from the support 10. The detaching device 300 may be a razor blade, but is not limited thereto, and various devices may be used.

Figure 2E:
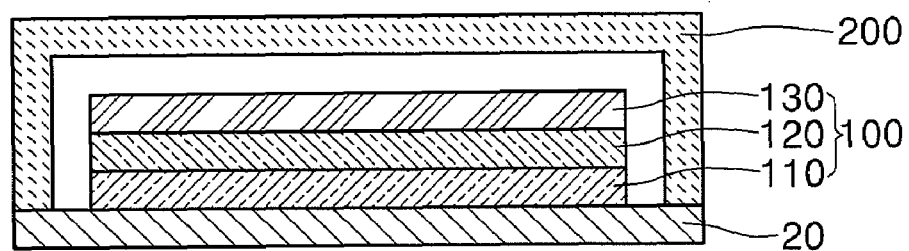

Referring to FIG. 2E, the support 10 is detached from the flexible layer 20 to form an OLED display device according to an exemplary embodiment of the present invention.

Here, while the second metal layer 32 under the flexible layer 20 are generally desirable to be separated together with the support 10, for a smooth process, a joining part between first and second radical layers 41 and 42 may be separated. As a result, the second metal layer 32 may remain under the flexible layer 20 after separation of the support 10 and the flexible layer 20.

In at least one embodiment of the present invention, regardless of the surface roughness of a support and a flexible layer, a uniform joining between the support and flexible layer can be achieved, which thus can reduce manufacturing costs and time.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A joining method for an organic light emitting diode (OLED) display device, the method comprising:
   providing a support and a flexible substrate;
   forming a first metal layer on one side of the support and a second metal layer on a first side of the flexible substrate;
   performing a cleaning process on the first metal layer and the second metal layer;
   forming a first radical layer on the first metal layer and a second radical layer on the second metal layer by a plasma process;
   joining the first radical layer to the second radical layer so that the flexible substrate, second metal layer, second radical layer, first radical layer, first metal layer and support are stacked in this order;
   forming an OLED display device on a second side of the flexible substrate, wherein the second side is opposing the first side; and
   detaching the first side of the flexible substrate from the second metal layer.

2. The method of claim 1, wherein the cleaning process comprises first to third cleaning processes, wherein the first and third cleaning processes are to dry the metal layers after immersing them in deionized water or organic cleaning liquid, and wherein the second cleaning process is performed by D-sonic and rinse methods using deionized water.

3. The method of claim 1, wherein the first metal layer and the second metal layer are formed by one of the following: an ion exchange method, an adsorption method, an ion injection method, a coating method, a sputtering method and a deposition method.

4. The method of claim 1, wherein the first metal layer and the second metal layer are formed to a thickness of about 1000 Å to about 10000 Å.

5. The method of claim 1, wherein the first metal layer and the second metal layer comprise one of iron, nickel, tin, zinc, chrome, cobalt, silicon, magnesium, titanium, zirconium, aluminum, silver, copper and an alloy thereof.

6. The method of claim 1, wherein the first radical layer and the second radical layer are joined to each other by covalent bonding.

7. The method of claim 1, wherein the joining process comprises first and second joining processes, wherein the first joining process is performed at room temperature, and wherein the second joining process is performed by pressing and annealing.

8. A method of fabricating an organic light emitting diode (OLED) display device, comprising:
   providing a support and a flexible substrate, wherein the flexible substrate comprises first and second surfaces opposing each other;
   forming a first metal layer on one side of the support and a second metal layer on the first surface of the flexible substrate;
   performing a cleaning process on the first metal layer and the second metal layer;
   forming a first radical layer on the first metal layer and a second radical layer on the second metal layer;
   joining the first radical layer to the second radical layer so that the flexible substrate, second metal layer, second radical layer, first radical layer, first metal layer and support are stacked in this order;
   forming an OLED display device on the second surface of the flexible substrate, wherein the OLED display device comprises a first electrode, an organic layer having an emission layer, and a second electrode; and
   detaching the first surface of the flexible substrate from the second metal layer.

9. The method of claim 8, wherein the cleaning process comprises first to third cleaning processes, wherein the first and third cleaning processes are to dry the metal layers after immersing them in deionized water or organic cleaning liquid, and wherein the second cleaning process is performed by D-sonic and rinse methods using deionized water.

10. The method of claim 8, wherein the first metal layer and the second metal layer are formed by one of the following: an ion exchange method, an adsorption method, an ion injection method, a coating method, a sputtering method and a deposition method.

11. The method of claim 8, wherein the first metal layer and the second metal layer are formed to a thickness of about 1000 Å to about 10000 Å.

12. The method of claim 8, wherein the first metal layer and the second metal layer comprise one of iron, nickel, tin, zinc, chrome, cobalt, silicon, magnesium, titanium, zirconium, aluminum, silver, copper and an alloy thereof.

13. The method of claim 8, wherein the first radical layer and the second radical layer are formed by a plasma process.

14. The method of claim 8, wherein the joining process comprises first and second joining processes, wherein the first joining process is performed at room temperature, and wherein the second joining process is performed by pressing and annealing.

15. A joining method for a flat panel display device which comprises a flexible substrate, the method comprising:
   providing a support and the flexible substrate, wherein the flexible substrate comprises first and second surfaces opposing each other;
   forming a first metal layer on one side of the support and a second metal layer on the first surface of the flexible substrate;
   joining the first metal layer to the second metal layer;
   forming a flat panel display device on the second surface of the flexible substrate; and
   detaching the first surface of the flexible substrate from the second metal layer so that the flexible substrate is incorporated into the flat panel display device.

16. The joining method for a flat panel display device of claim 15, further comprising:
   forming a first radical layer on the first metal layer and a second radical layer on the second metal layer, wherein the first radical layer is joined to the second radical layer so that the flexible substrate, second metal layer, second radical layer, first radical layer, first metal layer and support are stacked in this order.

* * * * *